(12) United States Patent
Iriuda et al.

(10) Patent No.: US 11,282,721 B2
(45) Date of Patent: Mar. 22, 2022

(54) VERTICAL HEAT TREATMENT APPARATUS

(71) Applicant: TOKYO ELECTRON LIMITED, Tokyo (JP)

(72) Inventors: Hiroki Iriuda, Nirasaki (JP); Kohei Fukushima, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/661,335

(22) Filed: Oct. 23, 2019

(65) Prior Publication Data

US 2020/0058526 A1 Feb. 20, 2020

Related U.S. Application Data

(62) Division of application No. 15/295,183, filed on Oct. 17, 2016, now abandoned.

(30) Foreign Application Priority Data

Oct. 21, 2015 (JP) .................................. 2015-207357

(51) Int. Cl.
*H01L 21/67* (2006.01)
*H01L 21/673* (2006.01)
(Continued)

(52) U.S. Cl.
CPC .... *H01L 21/67109* (2013.01); *C23C 16/4584* (2013.01); *C23C 16/45591* (2013.01); *H01L 21/67309* (2013.01)

(58) Field of Classification Search
CPC ......... H01L 21/67109; H01L 21/67309; H01L 21/67098; H01L 21/687; H01L 21/68764;
(Continued)

(56) References Cited

U.S. PATENT DOCUMENTS 5,334,257 A * 8/1994 Nishi ................ H01L 21/67781
118/500
2001/0050054 A1 12/2001 Kwag et al.
(Continued)

FOREIGN PATENT DOCUMENTS

JP 2005-056908 A 3/2005
JP 4083331 A 2/2008

*Primary Examiner* — Aiden Lee
(74) *Attorney, Agent, or Firm* — Nath, Goldberg & Meyer; Jerald L. Meyer; Tanya E. Harkins

(57) ABSTRACT

A vertical heat treatment apparatus includes: a substrate holder including a column, substrate holding parts configured to hold the substrates, and gas flow guide parts installed in the column in a corresponding relationship with the substrates; an elevator stand configured to support the substrate holder and to load the substrate holder into the reaction vessel from below the reaction vessel; a rotating mechanism installed in the elevator stand and configured to rotate the substrate holder about a vertical axis; a process gas supply port and an exhaust port respectively formed at a rear side and a front side of a substrate holding region; and a plurality of baffle parts installed independently of the substrate holder so that the baffle parts protrude from the outside toward spaces between the gas flow guide parts adjoining each other and run into the spaces.

7 Claims, 12 Drawing Sheets

(51) Int. Cl.
*C23C 16/455* (2006.01)
*C23C 16/458* (2006.01)

(58) Field of Classification Search
CPC ......... H01L 21/68771; H01L 21/68785; H01L 21/68792; C23C 16/455; C23C 16/45563; C23C 16/45574; C23C 16/4587; C23C 16/4588; C23C 16/4584; C23C 16/45591; C23C 16/45559; C23C 14/46; H01J 37/3244; H01J 37/32715; H01J 37/32733; H01J 37/32743
See application file for complete search history.

(56) References Cited

U.S. PATENT DOCUMENTS

| | | |
|---|---|---|
| 2003/0049372 A1 | 3/2003 | Cook et al. |
| 2009/0305512 A1 | 12/2009 | Matsuura et al. |
| 2011/0177233 A1 | 7/2011 | Picard |
| 2012/0216743 A1 | 8/2012 | Itoh et al. |

* cited by examiner

VERTICAL HEAT TREATMENT APPARATUS

CROSS-REFERENCE TO RELATED APPLICATION

This application is a Divisional Application of U.S. patent application Ser. No. 15/295,183 filed on Oct. 17, 2016, which claims the benefit of Japanese Patent Application No. 2015-207357, filed on Oct. 21, 2015, in the Japan Patent Office, the disclosure of each is incorporated herein in its entirety by reference.

TECHNICAL FIELD

The present disclosure relates to a technique of performing a heat treatment with respect to a plurality of substrates disposed in a shelf-like fashion, within a vertical reaction vessel surrounded by a heating part.

BACKGROUND

As one type of semiconductor manufacturing apparatuses, a vertical heat treatment apparatus is used that performs a heat treatment such as a film forming process or the like, with respect to a plurality of substrates, which is held by a substrate holder in a shelf-like fashion and is loaded into a vertical reaction vessel surrounded by a heating part. As a method of forming a flow of a process gas, a method is used having gas injectors and exhaust ports disposed at a rear side and a front side of a substrate holding region and forming a transverse flow (so-called cross flow) of a process gas.

The aforementioned method is a technique which has been studied on the basis of a concept of efficiently supplying a process gas to individual substrates. Since the gap between the substrates and the wall of the reaction vessel is wider than the gap between the substrates, a process gas injected from individual gas injection holes of a gas injector easily passes through the gap existing at the outer side of the substrates. For that reason, the gas supplied between the substrates is exhausted in a state close to a diffusion flow at a low flow velocity.

In the meantime, the design of a device becomes miniaturized and complicated and a surface area of a processed surface of a substrate, on which a film forming process is performed, becomes larger. Thus, if a flow velocity of a process gas flowing along a processed surface of a substrate is low, a difference in the concentration of a film forming gas becomes larger between a region close to gas injection holes and a region distant from the gas injection holes. This may result in deterioration in the uniformity of an in-plane film thickness distribution. In addition, the deposition rate is low.

For example, there is known a structure in which, when the direction facing from a gas supply pipe toward a center axis of wafers is assumed to be from the side, arc-shaped partition plates extending along the outer peripheral edges of the wafers are disposed at the left and right sides of a wafer boat having columns that hold the wafers in a shelf-like fashion. However, in this structure, the space between the outer peripheral edges of the wafers and the partition plates constitutes a so-called cavity over an extent from the uppermost side to the lowermost side. It is therefore impossible to sufficiently reduce the conductance in the outer region of the wafers as compared to the conductance in the regions between the wafers.

Furthermore, there is known a configuration which includes a wafer boat having an outer ring portion positioned at the outer side of wafers and an annular partition plate installed in an inner wall of a reaction tube so as to face an outer end surface of the outer ring portion. However, in this configuration, it is necessary to set the gap between the outer ring portion and the annular partition plate at a dimension anticipating the axis deflection of the wafer boat so that the outer ring portion and the annular partition plate do not collide with each other during rotation of the wafer boat. It is therefore impossible to sufficiently reduce the conductance in an outer region of the wafers.

SUMMARY

Some embodiments of the present disclosure provide a vertical heat treatment apparatus capable of supplying a process gas between substrates in an efficient manner and at a high flow velocity.

According to one embodiment of the present disclosure, there is provided a vertical heat treatment apparatus for performing a process with respect to a plurality of substrates disposed in a shelf-like fashion within a vertical reaction vessel surrounded by a heating part by forming a gas flow of a process gas flowing in a transverse direction from one side toward the other side, including: a substrate holder including a column, a plurality of substrate holding parts installed along the column and configured to hold the substrates, and a plurality of gas flow guide parts installed in the column in a corresponding relationship with the substrates and formed so that peripheral edge portions of the gas flow guide parts protrude outward beyond the substrates; an elevator stand configured to support the substrate holder and to load the substrate holder into the reaction vessel from below the reaction vessel; a rotating mechanism installed in the elevator stand and configured to rotate the substrate holder about a vertical axis; a process gas supply port and an exhaust port respectively formed at a rear side and a front side of a substrate holding region where the substrates are held; and a plurality of baffle parts installed independently of the substrate holder at a left side and a right side of the substrate holding region so that the baffle parts protrude from the outside toward spaces between the gas flow guide parts adjoining each other and run into the spaces.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
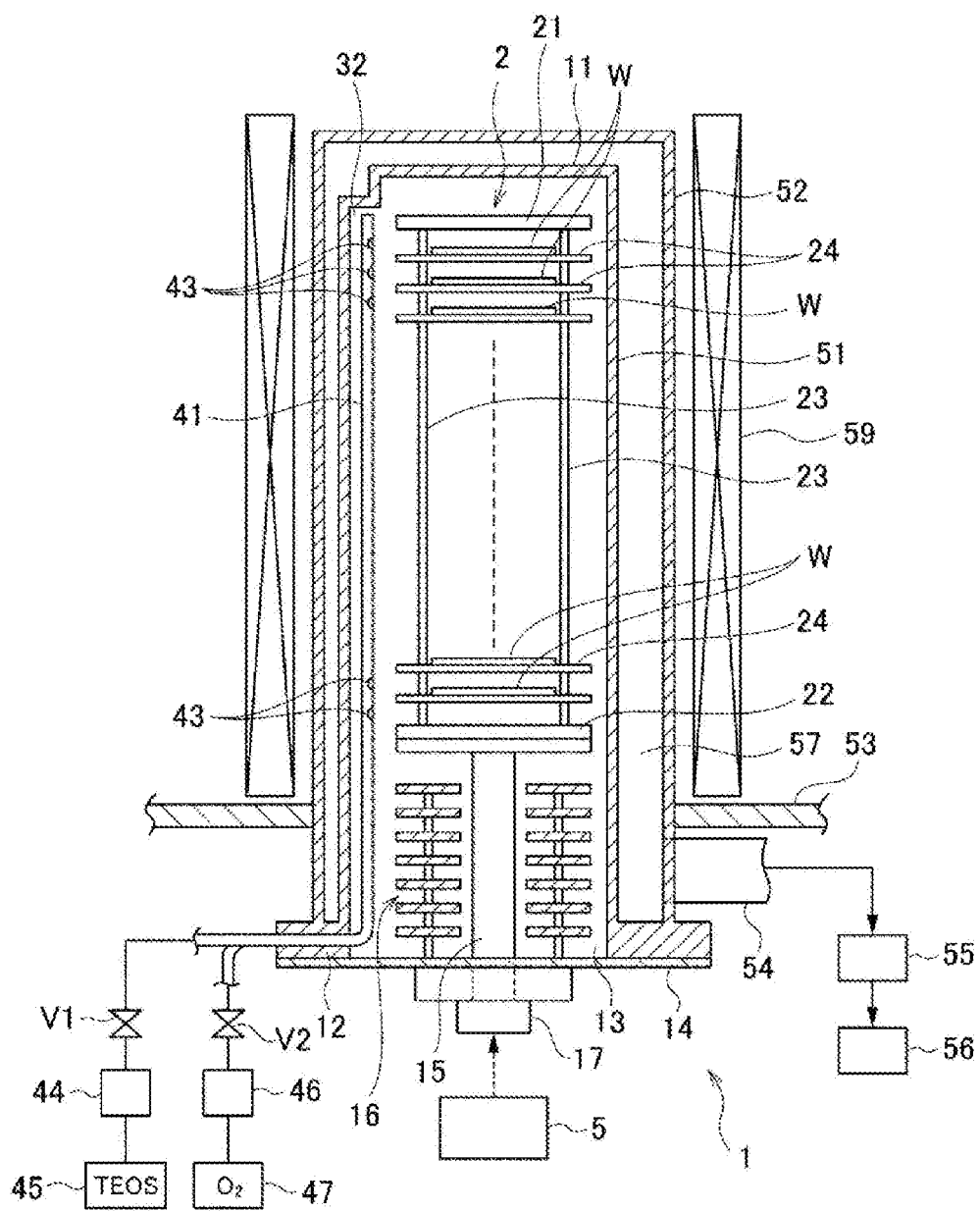
FIG. 1 is a longitudinal sectional view of a vertical heat treatment apparatus according to a first embodiment of the present disclosure.
Figure 2:
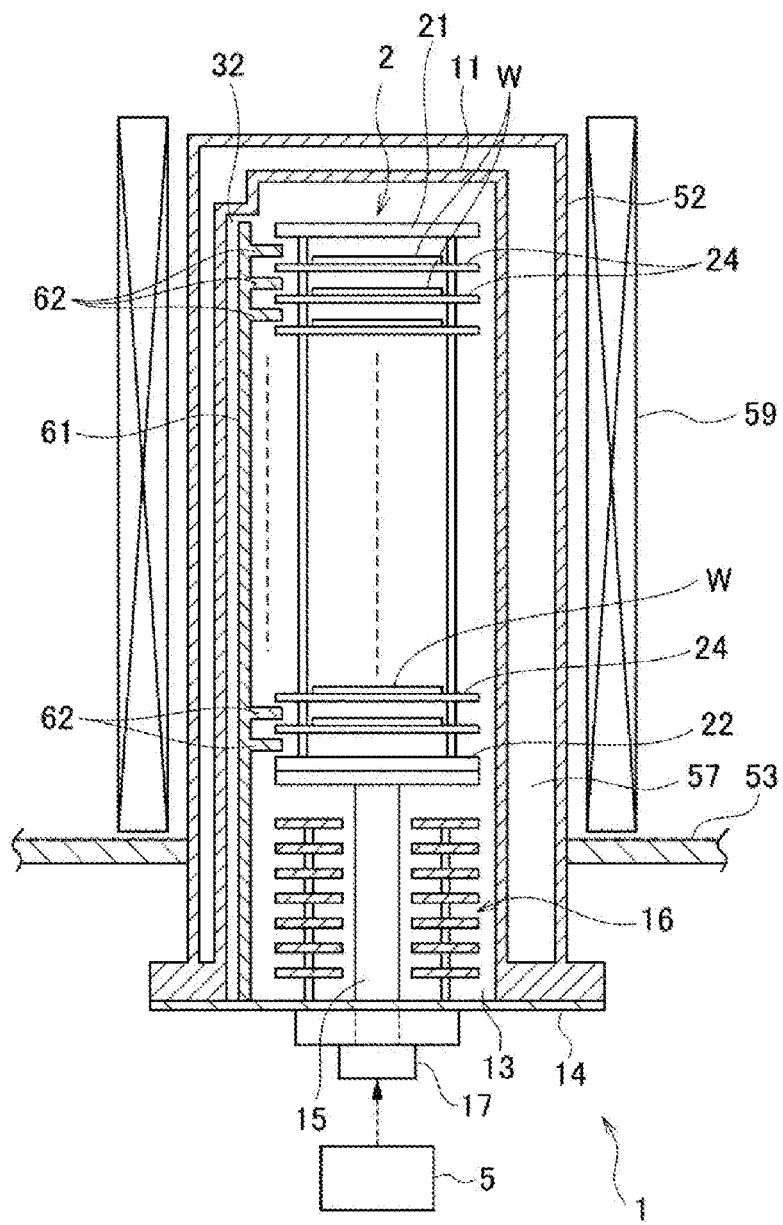
FIG. 2 is a longitudinal sectional view of the vertical heat treatment apparatus.

A vertical heat treatment apparatus 1 according to a first embodiment of the present disclosure will be described with reference to FIGS. 1 and 2, which are longitudinal sectional view, and FIG. 3, which is a transverse plan view. The vertical heat treatment apparatus 1 is to form $SiO_2$ (silicon oxide) films on wafers W as circular substrates, using chemical vapor deposition (CVD). In the drawings, reference numeral 11 designates a reaction vessel made of, for example, quartz. The reaction vessel 11 is formed in a vertical cylindrical shape with a roof. A lower end portion of the reaction vessel 11 extends outward to form a flange 12. Specifically, FIGS. 1 and 2 illustrate longitudinal cross sections taken at mutually-different positions in a circumferential direction, FIG. 1 being a sectional view taken along line A-A in FIG. 3 and FIG. 2 being a sectional view taken along line B-B in FIG. 3.

A region surrounded by the flange 12 in the reaction vessel 11 is opened as a substrate loading/unloading opening 13 and is air-tightly closed by a quartz circular lid 14 installed in a boat elevator (not shown). A rotary shaft 15 extending in a vertical direction (longitudinal direction) is installed to pass through the central portion of the lid 14 used as an elevator stand. A wafer boat 2 used as a substrate holder is supported on an upper end portion of the rotary shaft 15.

Figure 4:
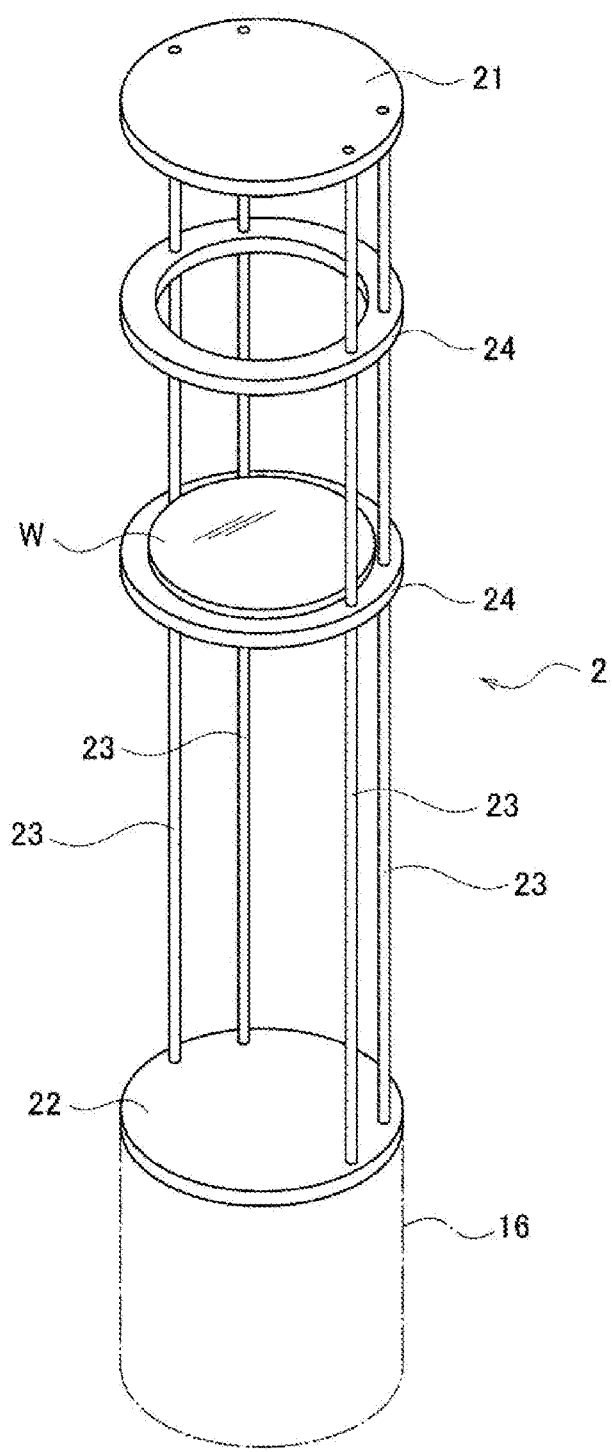
FIG. 4 is a perspective view of a wafer boat which is loaded into a reaction vessel installed in the vertical heat treatment apparatus.

The wafer boat 2 will be described with reference to the perspective view of FIG. 4. The wafer boat 2 is made of quartz and includes a horizontal circular top plate 21, a circular bottom plate 22 disposed in parallel to the top plate 21, and four vertical columns 23. The columns 23 are installed in a mutually-spaced-apart relationship along peripheries of the top plate 21 and the bottom plate 22 so that the wafers W can be transferred from the lateral side of the wafer boat 2 to circular ring plates 24 (to be described later). The columns 23 are merely configured to interconnect the top plate 21, the bottom plate 22 and the ring plates 24. The number of the columns 23 installed in the wafer boat 2 is not limited to four as in the example illustrated in FIG. 4 but may be three or less, or five or more.

A substrate holding region is defined between the top plate 21 and the bottom plate 22. The ring plates 24 which constitute substrate holding parts are installed in the substrate holding region in a mutually-spaced-apart relationship in multiple stages along an up-down direction. The columns 23 penetrate peripheral edge portions of the respective ring plates 24. Each of the ring plates 24 is horizontally supported by the respective columns 23. The outer circumference of each of the ring plates 24 is formed to have a size larger than the diameter of the wafers W. The wafers W are held on the ring plates 24 so that the centers of the wafers W are aligned with the centers of the ring plates 24. Thus, the peripheral edge portions of the ring plates 24 protrude outward beyond the wafers W. As will be described later, the peripheral edge portions of the ring plates 24 constitute gas flow guide parts for guiding gas flows generated within the reaction vessel 11. For the sake of convenience in illustration, only two of the ring plates 24 are illustrated in FIG. 4.

The wafer boat 2 is configured to move up and down between a process position (a position illustrated in FIGS. 1 to 3) at which the wafer boat 2 is loaded into the reaction vessel 11 and the substrate loading/unloading opening 13 of the reaction vessel 11 is closed by the lid 14 and a substrate transfer position defined below the reaction vessel 11. The substrate transfer position refers to a position where the wafers W are transferred with respect to the wafer boat 2 by a transfer mechanism (not shown) installed within a loading area. The rotary shaft 15 is configured to rotate about a vertical axis by a motor 17 that constitutes a rotating mechanism installed in the lid 14. Upon rotating the rotary shaft 15, the wafer boat 2 mounted on the rotary shaft 15 rotates about the centers of the respective wafers W held on the wafer boat 2, namely about a vertical axis. In the drawings, reference numeral 16 designates a heat insulation unit installed in the lid 14. The heat insulation unit 16 is formed of a plurality of ring-shaped plates which overlaps in a spaced-apart relationship in an up-down direction and which surrounds the rotary shaft 15. The heat insulation unit 16 provides heat insulation between the wafer boat 2 and the lid 14.

In the sidewall of the reaction vessel 11, an expansion region 31, an expansion region 32 and an expansion region 33, which respectively bulge outward, are formed in a mutually-spaced-apart relationship in the circumferential direction of the reaction vessel 11 and are sequentially disposed clockwise when viewed from the top. The expansion regions 31 to 33 are vertically-elongated regions which are formed at the process position so as to extend from the upper end portion of the wafer boat 2 to the lower end portion of the reaction vessel 11. In the expansion region 32, distal end portions of vertical gas injectors 41 and 42 formed in a rod shape are installed in a mutually-spaced-apart relationship in the circumferential direction of the reaction vessel 11. In the distal end portions of the vertical gas injectors 41 and 42, a plurality of gas injection holes 43 is formed in a spaced-apart relationship in a vertical direction so that the gas injection holes 43 can inject a process gas toward the central portions of the respective wafers W held on the wafer boat 2 at the process position.

A base end portion of the gas injector 41 is bent to horizontally extend outward and to pass through the flange 12 in a radial direction. The base end portion of the gas injector 41 is coupled to a supply source 45 of a tetraethoxysilane (TEOS) gas via a valve V1 and a mass flow controller 44 in the named order. Similar to the base end portion of the gas injector 41, a base end portion of the gas injector 42 is bent to horizontally extend outward and to pass through the flange 12 in the radial direction. The base end portion of the gas injector 42 is coupled to a supply source 47 of an oxygen ($O_2$) gas via a valve V2 and a mass flow controller 46 in the named order. That is to say, a TEOS gas as a process gas is injected from the gas injection holes 43 of the gas injector 41 and an $O_2$ gas as a process gas is injected from the gas injection holes 43 of the gas injector 42.

A region facing the expansion region 32 in the sidewall of the reaction vessel 11 is opened and configured as an exhaust port 51. The exhaust port 51 is formed in a rectangular slit shape so as to extend in an up-down direction and is formed to extend from a height level of the top plate 21 of the wafer boat 2 to a height level of the bottom plate 22. By performing an exhaust operation through the exhaust port 51 and supplying the respective process gases from the gas injectors 41 and 42, it is possible to form a transverse flow (cross flow) of the process gases.

A roofed outer tube 52 configured to surround the reaction vessel 11 is installed outside the reaction vessel 11. A lower end of the outer tube 52 is connected to the flange 12 of the reaction vessel 11. In FIGS. 1 and 2, reference numeral 53 designates a support plate that surrounds the periphery of the outer tube 52. The outer tube 52 and the reaction vessel 11 are supported by the support plate 53. A upstream end of an exhaust pipe 54 is connected to the outer tube 52 at the lower side of the exhaust port 51. A downstream end of the exhaust pipe 54 is coupled to an exhaust mechanism 56 which is configured by a vacuum pump or the like, through an exhaust amount adjustment part 55 which is configured by a valve or the like. A buffer space 57 defined between the outer tube 52 and the reaction vessel 11 is exhausted through the exhaust pipe 54, whereby the exhaust operation through the exhaust port 51 is performed. In FIGS. 1 and 2, reference numeral 59 designates a heater as a heating part. The heater 59 is installed above the support plate 53 so as to surround the lateral periphery of the outer tube 52 and is configured to heat the interior of the reaction vessel 11 so that the wafers W have a predetermined temperature. In FIG. 3, the heater 59 is not shown.

Hereinafter, for the sake of convenience, the vertical heat treatment apparatus 1 will be described under the assumption that a side at which the expansion region 32 is formed is a front side and a side at which the exhaust port 51 is formed is a rear side. The expansion regions 31 and 33 will be additionally described. The expansion regions 31 and 33 are formed at the front side of the reaction vessel 11 in an arc shape when viewed from the top.

Two pillars 61 as support parts are installed in the lid 14 so as to extend vertically upward. A transfer mechanism gains access to the wafer boat 2 existing in the substrate transfer position below the reaction vessel 11 from the rear side and performs the transfer of the wafers W. To do this, the respective pillars 61 are installed at the front side of the lid 14 so as not to hinder the transfer of the wafers W and are configured so that the pillars 61 are accommodated in the respective expansion regions 31 and 33 when the wafer boat 2 is loaded toward the process position. In this embodiment, the pillars 61 are formed in an arc shape when viewed from the top so as to extend along lateral peripheral surfaces of the respective expansion regions 31 and 33.

Horizontal baffle plates 62 as baffle parts are installed in the respective pillars 61 in multiple stages. The baffle plates 62 are formed in an arc shape so as to extend along the respective expansion regions 31 and 33 when viewed from the top. The baffle plates 62 horizontally protrude from the pillars 61 toward the center of the reaction vessel 11 and are installed in multiple stages. Accordingly, the expansion regions 31 and 33 are regions which are formed by causing portions facing the baffle plates 62 in the sidewall of the reaction vessel 11 to bulge outward. While the wafer boat 2 is rotatable with respect to the lid 14, the baffle plates 62 are fixedly secured to the lid 14. In other words, the baffle plates 62 are installed independently of the lid 14. The baffle plates 62 and the ring plates 24 serve to reduce gaps formed at outer sides of the wafers W, thus reducing the conductance of the process gases at the outer sides of the wafers W.

Figure 5:
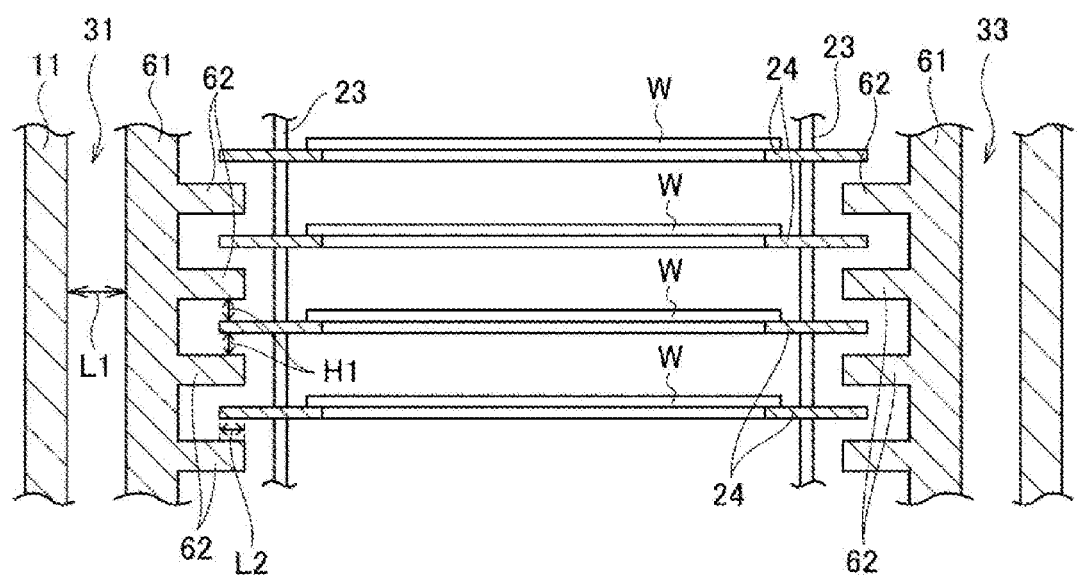
FIG. 5 is a longitudinal sectional view of the wafer boat and the reaction vessel.

The positional relationship between the reaction vessel 11, the wafer boat 2 existing at the process position and the baffle plates 62 will be described with reference to the longitudinal sectional view of FIG. 5. The baffle plates 62 are respectively positioned at the height levels differing from the height levels of the wafers W and the ring plates 24. A distal end of each of the baffle plates 62 runs toward and extends into the gap between the top plate 21 of the wafer boat 2 and the ring plate 24 positioned just below the top plate 21, the gaps between the adjoining ring plates 24, and the gap between the bottom plate 22 and the ring plate 24 positioned just above the bottom plate 22. A distance L1 between the lateral peripheral surfaces of the expansion regions 31 and 33 and the pillars 61 in the reaction vessel 11 is, for example, 9.0 mm. Horizontal distance L2 between the peripheral ends of the ring plates 24 and the distal ends of the baffle plates 62 is, for example, 10.0 mm. That is to say, the ring plates 24 and the baffle plates 62 overlap each other when viewed from the top. In the mutually-adjoining baffle plates 62 and the ring plates 24 extending between the baffle plates 62, a height H1 of each of gaps formed between the respective ring plate 24 and the baffle plates 62 is, for example, 3 mm. If the distance L2 grows larger and if the height H1 grows smaller, the gap formed at the outer side of the wafers W becomes smaller. Thus, it is possible to reliably restrict the flow of the process gases, which will be described later.

It is conceivable that the deflection of an elevator shaft of the lid 14 occurs due to, for example, the limit in the operation accuracy of the vertical heat treatment apparatus 1. The expansion regions 31 and 33 described above are provided in order to prevent the pillars 61 under the vertical movement from interfering with the inner periphery of the reaction vessel 11 when the shaft deflection has occurred. In other words, the expansion regions 31 and 33 are provided in order to obtain the distance L1 between the reaction vessel 11 and the pillars 61 needed for the installation of the baffle plates 62, while realizing the configuration in which the baffle plates 62 are disposed at the outer side of the wafers W. In a case where the ring plates 24 and the baffle plates 62 are disposed at the same height, it is necessary to consider the deflection of the rotary shaft of the lid 14 as described in the Background section of the present disclosure. Thus, the positions of the distal ends of the baffle plates 62 are significantly limited in order to prevent the interference between the baffle plates 62 and the ring plates 24. However, since the baffle plates 62 are disposed at a height differing from the height of the ring plates 24 as described above, it may be possible to configure the baffle plates 62 so as to relatively largely protrude toward the center of the reaction vessel 11 so that the distal ends of the baffle plates 62 are positioned in the vicinity of the peripheral ends of the wafers W. That is to say, by disposing the baffle plates 62 at a height differing from the height of the ring plates 24, it is possible to further reduce the gap of the outer periphery of the reaction vessel 11. This makes it possible to reliably restrict the flow of the process gases, which will be described later.

As illustrated in FIGS. 1 and 2, the vertical heat treatment apparatus 1 includes a control part 5 configured by a computer. The control part 5 is configured to control the up-down movement of the lid 14, the temperature of the wafers W heated by the heater 59, the supply amount of the respective process gases regulated by the mass flow controllers 44 and 46 and valves V1 and V2, the exhaust amount adjusted by the exhaust amount adjustment part 55, the rotation of the rotary shaft 15 caused by the motor 17, and other operations. The control part 5 includes step groups which are combined so as to perform a series of processes which will be described later. A program is stored in the control part 5 in a state where the program is recorded in a memory medium such as, for example, a hard disc, a flexible disc, a compact disc, a magneto-optical disc (MO) or a memory card.

Next, descriptions will be made on a film forming process performed in the vertical heat treatment apparatus 1. First of all, the wafers W are transferred to the wafer boat 2 which is supported on the rotary shaft 15 and located at the substrate transfer position below the reaction vessel 11. The wafers W are held on the respective ring plates 24 in a shelf-like fashion. Thereafter, the lid 14 is moved upward. The wafer boat 2 is moved up to the process position from below the reaction vessel 11. The pillars 61 and the baffle plates 62 are accommodated within the expansion regions 31 and 33. The substrate loading/unloading opening 13 is closed. Then, the interior of the reaction vessel 11 is evacuated by the exhaust through the exhaust port 51 so that the interior of the reaction vessel 11 becomes a vacuum atmosphere having a predetermined pressure. The wafers W are heated to a predetermined temperature by the heater 59. Furthermore, the wafer boat 2 is rotated through the rotary shaft 15 by the motor 17.

Figure 6:
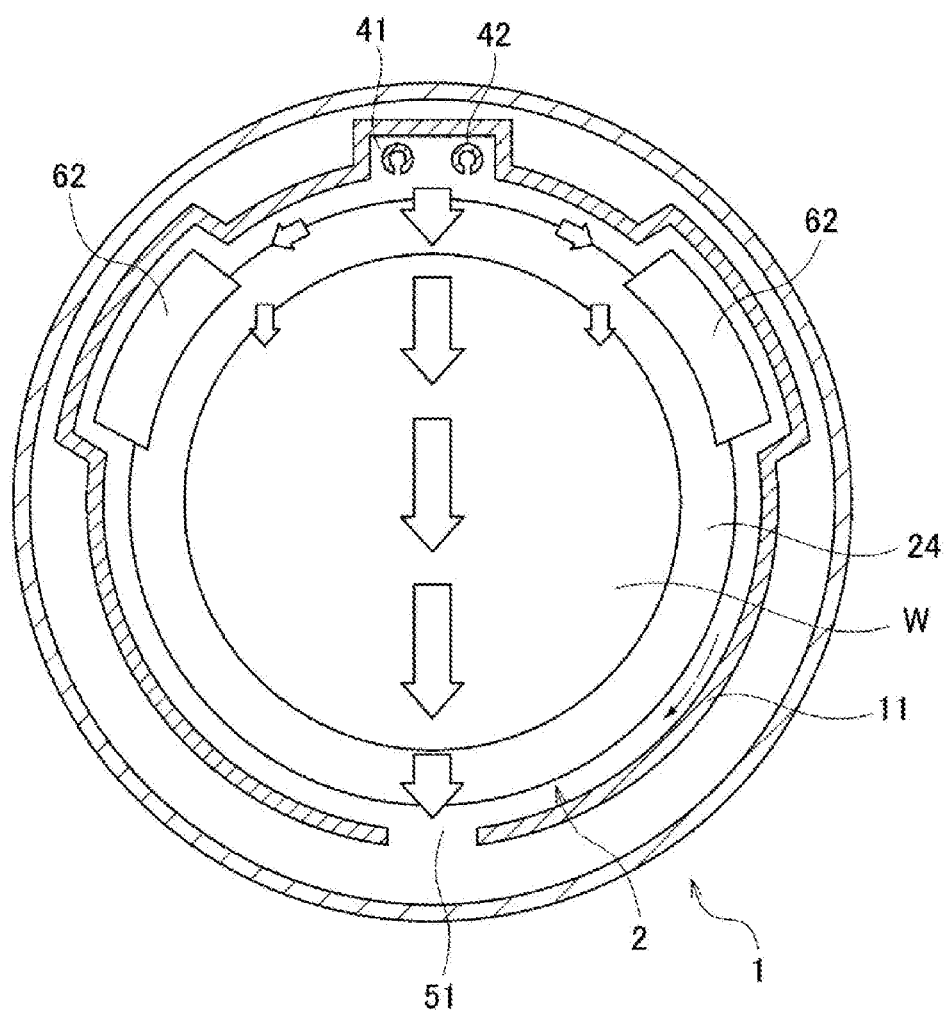
FIG. 6 is a schematic view showing a flow of a process gas within the reaction vessel.

Thereafter, a TEOS gas and an $O_2$ gas as process gases are injected from the respective injection holes 43 of the gas injectors 41 and 42 toward the central portions of the surfaces of the respective wafers W. Since the exhaust is performed through the exhaust port 51, the TEOS gas and the $O_2$ gas flow in the transverse direction from the front side toward the rear side within the reaction vessel 11. In FIG. 6, the flow of the process gases is indicated by white arrows. A dashed arrow in FIG. 6 indicates the rotation direction of the wafers W.

The peripheral edge portions of the ring plates 24 are positioned in the outer peripheries of the wafers W. Furthermore, the baffle plates 62 oriented toward the inner side of the ring plates 24 are installed so as to extend from the expansion regions 31 and 33 between the mutually-adjoining ring plates 24. Thus, when viewed from the respective process gases injected as above, the gaps of the left and right outer peripheries of the wafers W are kept small. This suppresses the process gases from diffusing to the outer peripheries of the wafers W, thus efficiently supplying the process gases to the gaps between the adjoining wafers W. When viewed from the process gases supplied to the gaps between the wafers W, the gaps in the circumferential direction of the wafers W are kept relatively small by the baffle plates 62. Thus, the diffusion of the process gases in the circumferential direction of the wafers W is suppressed. As a result, the process gases flow toward the exhaust port 51 across the wafers W at a relatively high flow velocity. Then, the process gases are exhausted from the exhaust port 51.

The process gases (the TEOS gas and the $O_2$ gas) flowing along the surfaces of the wafers W make a chemical reaction due to the heat of the wafers W. Thus, the molecules of $SiO_2$ are deposited on the surfaces of the wafers W so that a $SiO_2$ film is formed on each of the surfaces of the wafers W. If the deposition of the molecules of $SiO_2$ proceeds and if the thickness of the $SiO_2$ film reaches a predetermined thickness, the supply of the process gases from the gas injectors 41 and 42 is stopped. The lid 14 is moved downward. The wafer boat 2 is unloaded from the reaction vessel 11. Thus, the film forming process is completed.

In the vertical heat treatment apparatus 1, the process is performed using the wafer boat 2 in which the ring plates 24 respectively holding the wafers W and having the peripheral edge portions protruding outward beyond the wafers W are installed in the columns 23 in multiple stages. The baffle plates 62 independent of the wafer boat 2 are installed so that the baffle plates 62 protrude from the left and right outer sides of the wafer boat 2 at the process position within the reaction vessel 11 toward the gaps between the mutually-adjoining ring plates 24 and run into the gaps. With this configuration, it is possible to restrain the process gases injected from the gas injectors 41 and 42 from passing through the outer peripheries of the wafers W and moving toward the exhaust port 51. This makes it possible to supply the process gases to the surfaces of the respective wafers W in an efficient manner and at a relatively high flow velocity. By efficiently supplying the process gases in this way, it is possible to enhance the deposition rate (the increment amount of a film thickness per unit time) and to increase the throughput of the vertical heat treatment apparatus 1. Furthermore, by supplying the process gases to the wafers W at a relatively high flow velocity, it is possible to suppress generation of a deviation in the supply amount of the process gases in the front-rear diametrical direction of the rotating wafers W. This makes it possible to improve the film thickness uniformity in the wafers W.

As described above, the baffle plates 62 are installed in order to reduce the gaps existing at the outer side of the wafers W and to restrict the flow of the process gases. As illustrated in FIG. 5, the baffle plates 62 are configured so that the distal ends of the baffle plates 62 extend between the adjoining ring plates 24. This makes it possible to significantly reduce the gaps. It is therefore possible to reliably achieve the aforementioned effects. Even if the baffle plates 62 are installed so as not to extend into the gaps between the adjoining ring plates 24, the gaps existing at the outer side of the wafers W become smaller as compared with a case where the baffle plates 62 are not installed. Thus, the effects of the present disclosure are achieved. Accordingly, the baffle plates 62 may be formed so that the distal ends of the baffle plates 62 and the peripheral ends of the ring plates 24 overlap with each other, namely so that the distance L2 in FIG. 5 becomes 0 mm. In some embodiments, the baffle plates 62 may be formed so that the distal ends of the baffle plates 62 are spaced apart from the peripheral ends of the ring plates 24 toward the peripheral end of the reaction vessel 11.

Modification of First Embodiment

Figure 7:
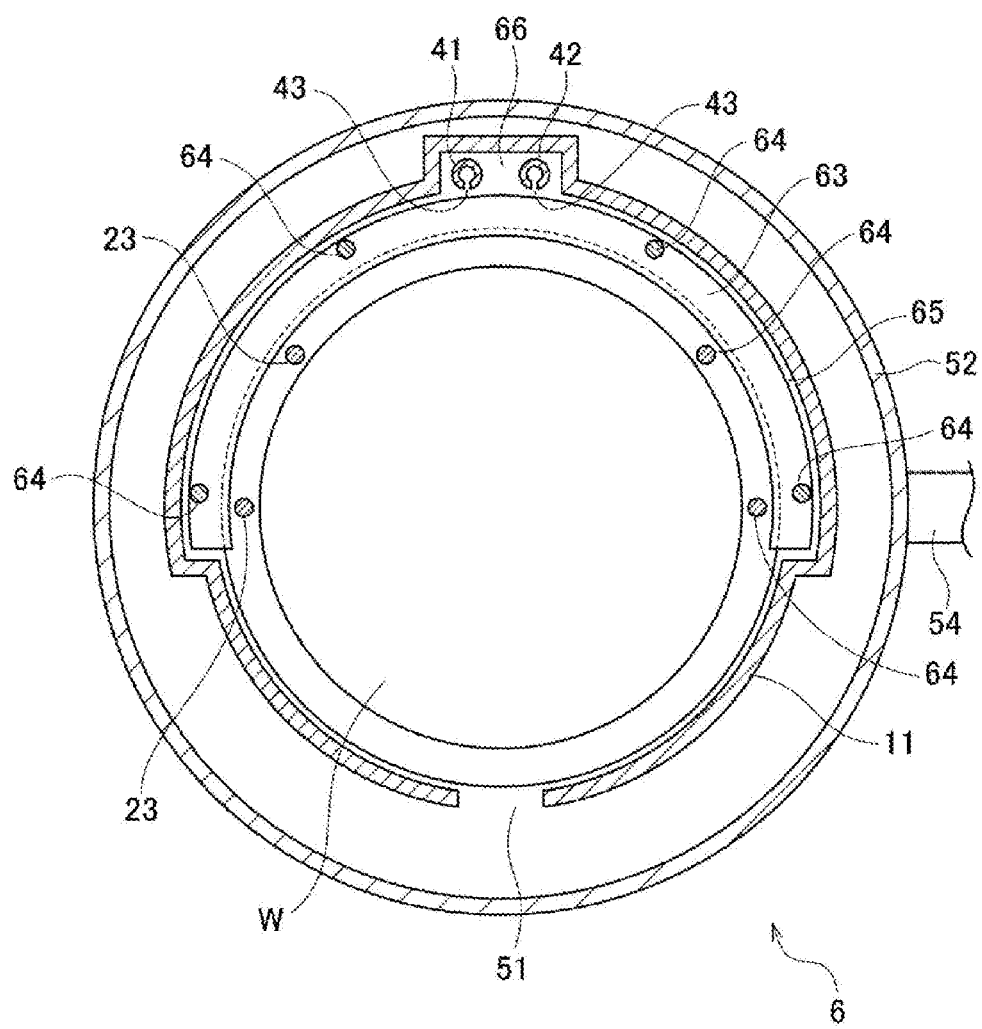
FIG. 7 is a transverse plan view of a vertical heat treatment apparatus according to a modification of the first embodiment.

A vertical heat treatment apparatus 6 according to a modification of the first embodiment will be described with reference to a transverse plan view of FIG. 7, with a focus on the differences from the vertical heat treatment apparatus 1. In the vertical heat treatment apparatus 6, baffle plates 63 having an arc shape when viewed from the top and extending along semicircles of the respective ring plates 24 are installed in place of the baffle plates 62. Each end of the arc is respectively disposed at the left and right sides of the reaction vessel 11. The longitudinal center portion of the arc is disposed at the front side within the reaction vessel 11. That is to say, the baffle plates 63 are formed in an arc shape when viewed from the top so as to become longer than the baffle plates 62. Except for the difference in shape, the baffle plates 63 are configured similar to the baffle plates 62. The baffle plates 63 are supported by, for example, rod-shaped vertical pillars 64 installed in a spaced-apart relationship along the circumferential direction of the reaction vessel 11. Except for the difference in the shape when viewed from the top, the pillars 64 are configured similar to the pillars 61 described above.

A region facing the baffle plates 63 in the sidewall of the reaction vessel 11 constitutes a first expansion region 65 bulging outward. The first expansion region 65 is configured similar to the expansion regions 31 and 33 except that the shape of the first expansion region 65 when viewed from the top differs from the shape of the expansion regions 31 and 33 when viewed from the top. Furthermore, the front side of the sidewall of the reaction vessel 11 defining the first expansion region 65 locally bulges outward of the reaction vessel 11 to form a second expansion region 66. Similar to the expansion region 32 described above, the gas injectors 41 and 42 are installed in the second expansion region 66. The injection holes 43 of the gas injectors 41 and 42 are opened so as to inject process gases between the adjoining ring plates 24.

Since the gaps formed at the outer side of the wafers W are kept relatively small by the ring plates 24 and the baffle plates 62, the process gases injected between the adjoining ring plates 24 are restrained from flowing toward the outer peripheries of the wafers W and are moved toward the exhaust port 51. Thus, according to the vertical heat treatment apparatus 6, similar to the vertical heat treatment apparatus 1, it is possible to supply the process gases to the respective wafers W in an efficient manner and at a relatively high flow velocity.

Second Embodiment

Next, a vertical heat treatment apparatus 7 according to a second embodiment will be described with reference to a transverse plan view of FIG. 8 and a longitudinal sectional view of FIG. 9, with a focus on the differences from the vertical heat treatment apparatus 1. In the vertical heat treatment apparatus 7, the expansion regions 31 and 33, the pillars 61 and the baffle plates 62 are not installed. Instead, baffle plates 71 corresponding to the baffle plates 62 are installed. Similar to the baffle plates 62, the baffle plates 71 are installed in multiple stages. Each of the baffle plates 71 protrude from four regions of the inner circumferential wall of the reaction vessel 11 spaced apart in the circumferential direction toward the gaps between the adjoining ring plates 24 of the wafer boat 2 disposed in the process position, so that the baffle plates 71 run into the gaps. In this embodiment, the baffle plates 71 are respectively installed at the front left and right sides and at the rear left and right sides within the reaction vessel 11.

Four cutouts 25 corresponding to the baffle plates 71 are formed in each of the ring plates 24 along the circumferential direction. When the wafer boat 2 is loaded into and unloaded from the reaction vessel 11, the lid 14 is moved up and down in a state where the orientation of the wafer boat 2 is adjusted by the motor 17 so that the cutouts 25 face the respective baffle plates 71 as illustrated in FIG. 8. Thus, the baffle plates 71 pass through the cutouts 25. The cutouts 25 are formed so as to prevent interference between the ring plates 24 and the baffle plates 71 even when the deflection of the elevator shaft of the wafer boat 2 occurs as described earlier.

In the vertical heat treatment apparatus 7, similar to the vertical heat treatment apparatus 1, a gas flow is formed by supplying and exhausting process gases and the wafer boat 2 is rotated. Thus, the wafers W are subjected to a film forming process. Due to the rotation of the wafer boat 2, the film forming process is performed while alternately repeating a state in which the distal end portions of the baffle plates 71 and the peripheral end portions of the ring plates 24 do not overlap with each other when viewed from the top (a state illustrated in FIG. 8) and a state in which the distal end portions of the baffle plates 71 and the peripheral end portions of the ring plates 24 overlap with each other when viewed from the top. Due to the installation of the ring plates 24 and the baffle plates 71, when viewed from the process gases injected into the reaction vessel 11, the gaps formed at the outer side of the wafers W is relatively small. Thus, in the vertical heat treatment apparatus 7, similar to the vertical heat treatment apparatus 1, it is possible to restrain the process gases from flowing toward the outer peripheries of the wafers W. When the baffle plates 71 and the ring plates 24 overlap with each other, the gaps existing at the outer side of the wafers W, which are viewed from the process gases, is very small. It is therefore possible to reliably restrain the process gases from flowing toward the outer peripheries of the wafers W.

By restricting the flow of the process gases in the aforementioned manner, the vertical heat treatment apparatus 7 may achieve the same effects as achieved by the vertical heat treatment apparatus 1. The baffle plates 71 of the vertical heat treatment apparatus 7 are fixed to the reaction vessel 11. It is therefore possible to install the baffle plates 71 regardless of the direction in which the wafer transfer mechanism gains access to the wafer boat 2. That is to say, the baffle plates 71 may be disposed in a free layout at the front, rear, left and right sides within the reaction vessel 11.

In the above embodiments, it is only necessary for the ring plates 24 of the wafer boat 2 to reduce the gaps existing at the outer side of the wafers W. Thus, the ring plates 24 need not be necessarily circular. As illustrated in the second embodiment, the cutouts 25 may be formed in the ring plates 24. The ring plates 24 may have, for example, an elliptical shape or a rectangular shape. Furthermore, the exhaust port 51 may be formed in an arbitrary shape in order to adjust the in-plane pressure between the respective wafers W. For example, the exhaust port 51 may be formed in a downwardly-tapered wedge-like slit shape. Alternatively, the exhaust port 51 may have a configuration in which a plurality of holes is formed in a spaced-apart relationship in an up-down direction so that the holes existing at the lower side have a smaller diameter. An exhaust flow path existing at the downstream side of the exhaust port 51 is not limited to the aforementioned configuration example. For example, instead of installing the outer tube 52, it may be possible to employ a configuration in which the exhaust port 51 is covered by a cover outside of the reaction vessel 11 and a space covered by the cover is exhausted through the exhaust pipe 54. In addition, it may be possible to employ a configuration in which the upstream end of the exhaust pipe 54 is connected to the front side of the outer tube 52 so that the process gases introduced into the exhaust port 51 pass through the upper side of the ceiling plate of the reaction vessel 11 and flow into the exhaust pipe 54.

Figure 10:
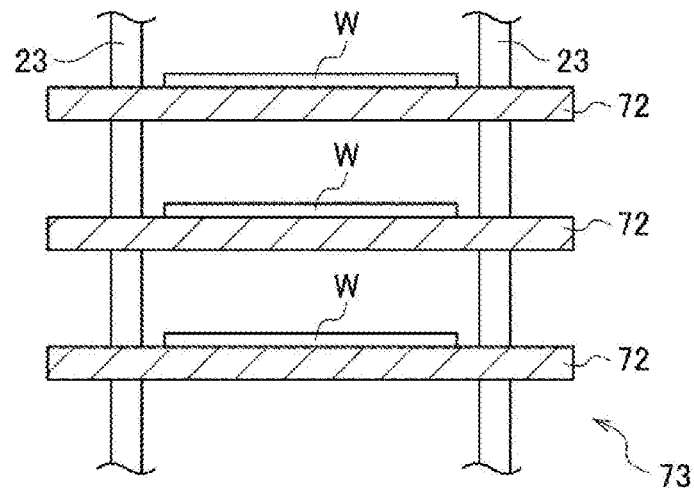
FIG. 10 is a schematic longitudinal sectional view illustrating another configuration of the wafer boat.
Figure 11:
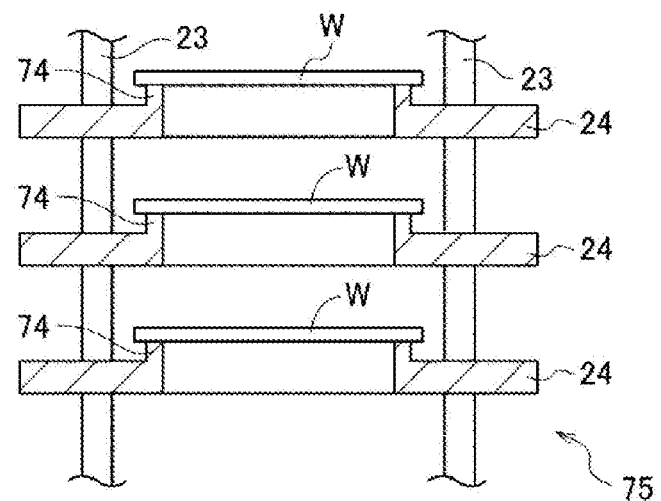
FIG. 11 is a schematic longitudinal sectional view illustrating another configuration of the wafer boat.

Furthermore, the configuration of the wafer boat is not limited to the aforementioned example. FIGS. 10 to 13 are schematic longitudinal sectional views illustrating wafer boats differing in configuration from the wafer boat 2. Hereinafter, the wafer boats illustrated in FIGS. 10 to 13 will be described with a focus on the differences from the wafer boat 2. In FIG. 10, there is illustrated a configuration example of the wafer boat 73 in which circular plates 72 are installed in place of the ring plates 24. Similar to the peripheral edge portions of the ring plates 24, peripheral edge portions of the circular plates 72 protrude outward beyond the peripheral edges of the wafers W mounted on the circular plates 72. In FIG. 11, there is illustrated a wafer boat 75 in which ring-shaped protrusions 74 are formed to extend along the inner peripheral edges of the ring plates 24. The wafers W are held on the respective protrusions 74.

Figure 12:
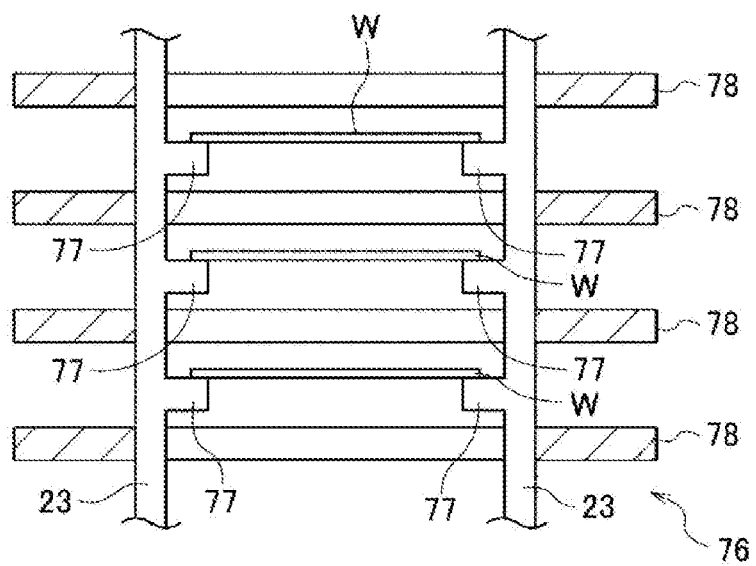
FIG. 12 is a schematic longitudinal sectional view illustrating another configuration of the wafer boat.
Figure 13:
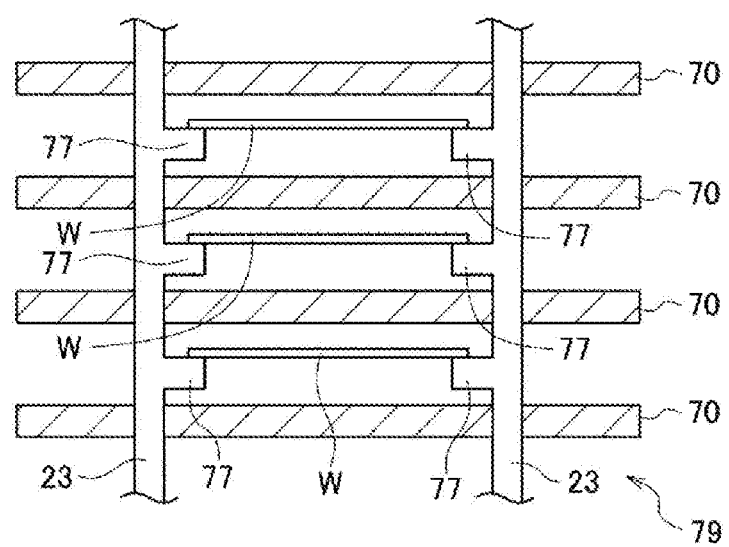
FIG. 13 is a schematic longitudinal sectional view illustrating another configuration of the wafer boat.

A wafer boat 76 illustrated in FIG. 12 includes holder bodies 77 protruding from the respective columns 23 toward the central portion of the region surrounded by the columns 23. The peripheral edge portions of the wafers W are held on the holder bodies 77. In the wafer boat 76, horizontal circular ring plates 78 are installed in multiple stages at a height differing from the height of the holder bodies 77 and the wafers W. The inner peripheral edges of the ring plates 78 are supported by the respective columns 23. Similar to the peripheral edge portions of the ring plates 24, the ring plates 78 are configured to restrict gas flow within the reaction vessel 11. That is to say, in the wafer boat 76, substrate holding parts and gas flow guide parts are installed independently of each other. A wafer boat 79 illustrated in FIG. 13 is configured substantially similar to the wafer boat 76. A difference resides in that horizontal circular plates 70 are installed in place of the ring plates 78.

As the transfer mechanism which transfers the wafers W to each of the wafer boats, a transfer mechanism having an arbitrary configuration may be used as long as the transfer mechanism is capable of transferring the wafers W to the wafer boat described above. For example, it may be possible to use a transfer mechanism including grippers that grip each of the wafers W by pressing the mutually-spaced-apart different positions of the side surface of each of the wafers W toward the center of each of the wafers W.

The vertical heat treatment apparatus 1 is not limited to an apparatus which performs a CVD-based film formation but may be an apparatus which performs an ALD (atomic layer deposition)-based film formation. In addition, it may be possible to install a plasma mechanism which converts the process gases injected from the gas injectors 41 and 42 to plasma and generates radicals until the process gases are supplied to the wafers W, so that active species such as the radicals or the like are supplied to the wafers W. In this case, the process gases pass between the adjoining wafers W at a relatively high flow velocity as described above. It is therefore possible to restrain the active species from being deactivated until the active species reach the respective portions of the surfaces of the wafers W. This makes it possible to enhance the throughput of the apparatus and to achieve process uniformity within the planes of the wafers W. Furthermore, the vertical heat treatment apparatus 1 is not limited to a film forming apparatus which performs a film forming process but may be configured as a modification apparatus which modifies the surfaces of the wafers W by heating the wafers W while supplying an inert gas such as, for example, a $N_2$ (nitrogen) gas or the like. Moreover, the configurations of the respective embodiments described above may be appropriately combined. For example, the pillars 64 of the vertical heat treatment apparatus 6 may be used as the pillars of the vertical heat treatment apparatus 1 which support the baffle plates 62.

Figure 3:
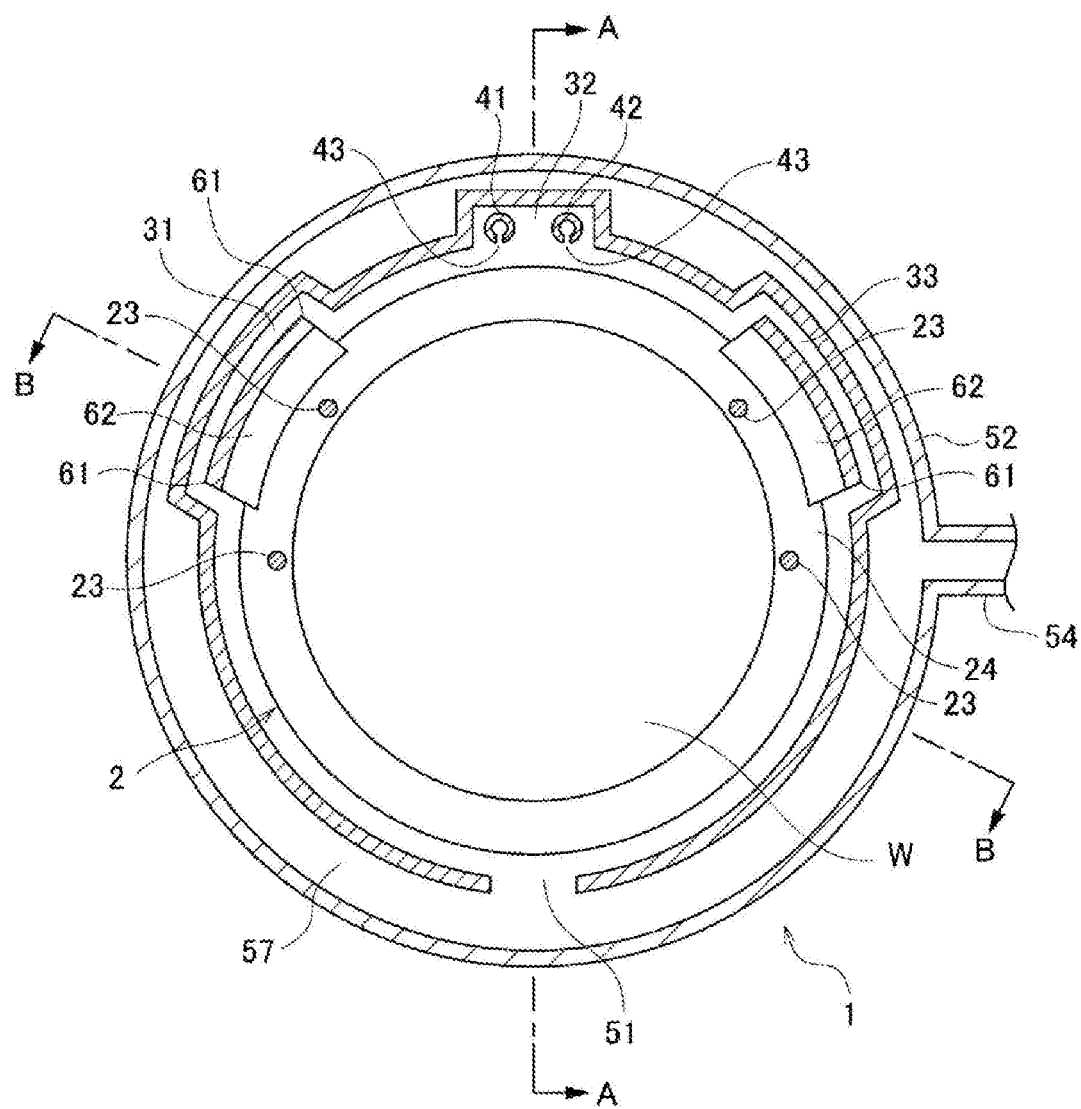
FIG. 3 is a transverse plan view of the vertical heat treatment apparatus.
Figure 8:
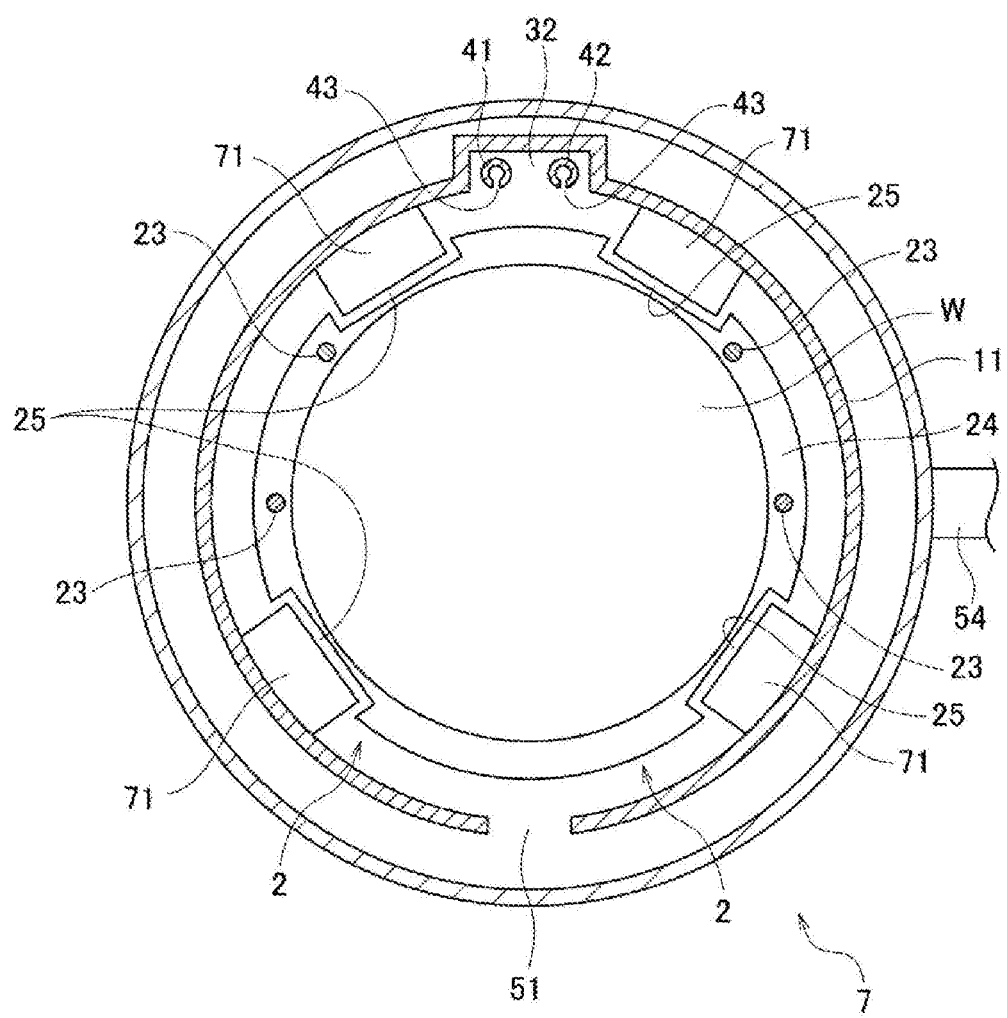
FIG. 8 is a transverse plan view of a vertical heat treatment apparatus according to a second embodiment of the present disclosure.
Figure 9:
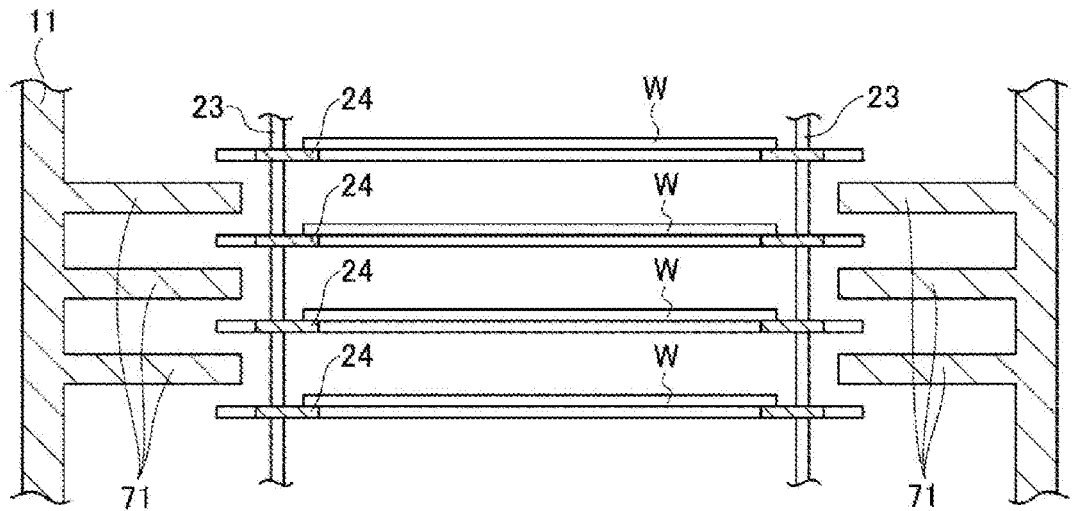
FIG. 9 is a longitudinal sectional view of a wafer boat and a reaction vessel that constitute the vertical heat treatment apparatus according to the second embodiment.

In the examples illustrated in FIGS. 3 and 8, the peripheral edge portions of the ring plates 24 of the wafer boat 2 are formed to protrude outward from the entire circumferences of the wafers W beyond the peripheral edges of the wafers W. However, it is only necessary for the ring plates 24 to have an action of restricting the gas flow as described above. The ring plates 24 are not limited to the configuration in which the peripheral edge portions of the ring plates 24 protrude outward from the entire circumferences of the wafers W. For example, cutouts may be formed in the peripheral edge portions of the ring plates 24 so that the cutouts face the centers of the ring plates 24 and so that the distal ends of the ring plates 24 are positioned inward of the peripheral edges of the wafers W. The ring plates 24 may be configured so that, when viewed from the top, the peripheral edge portions of the ring plates 24 protrude outward of the wafers W from the majority of the entire circumferences of the wafers W, for example, from the region of 70% or more of the entire circumferences of the wafers W. The cutouts are formed in a plurality of regions of the peripheral edge portions of the ring plates 24 so that, for example, when a transfer mechanism including a plurality of claws for supporting a plurality of mutually-spaced-apart regions of the peripheral edge portions of the rear surfaces of the wafers W moves up and down with respect to the ring plates 24 and transfers the wafers W to the ring plates 24, the claws can pass through the cutouts.

Evaluation Test

As evaluation test 1, there was conducted a simulation which perform a film forming process with respect to the wafers W having a diameter of 300 mm using the vertical heat treatment apparatus 1 described above. Then, a distribution of flow velocities of a process gas in the gaps between the adjoining wafers W under the film forming process was acquired. As comparative test 1, a simulation was conducted under the same conditions as those of evaluation test 1 except that the baffle plates 62, the pillars 61 and the expansion regions 31 and 32 are not formed. Similar to evaluation test 1, a distribution of flow velocities of a process gas was acquired.

Figure 14:
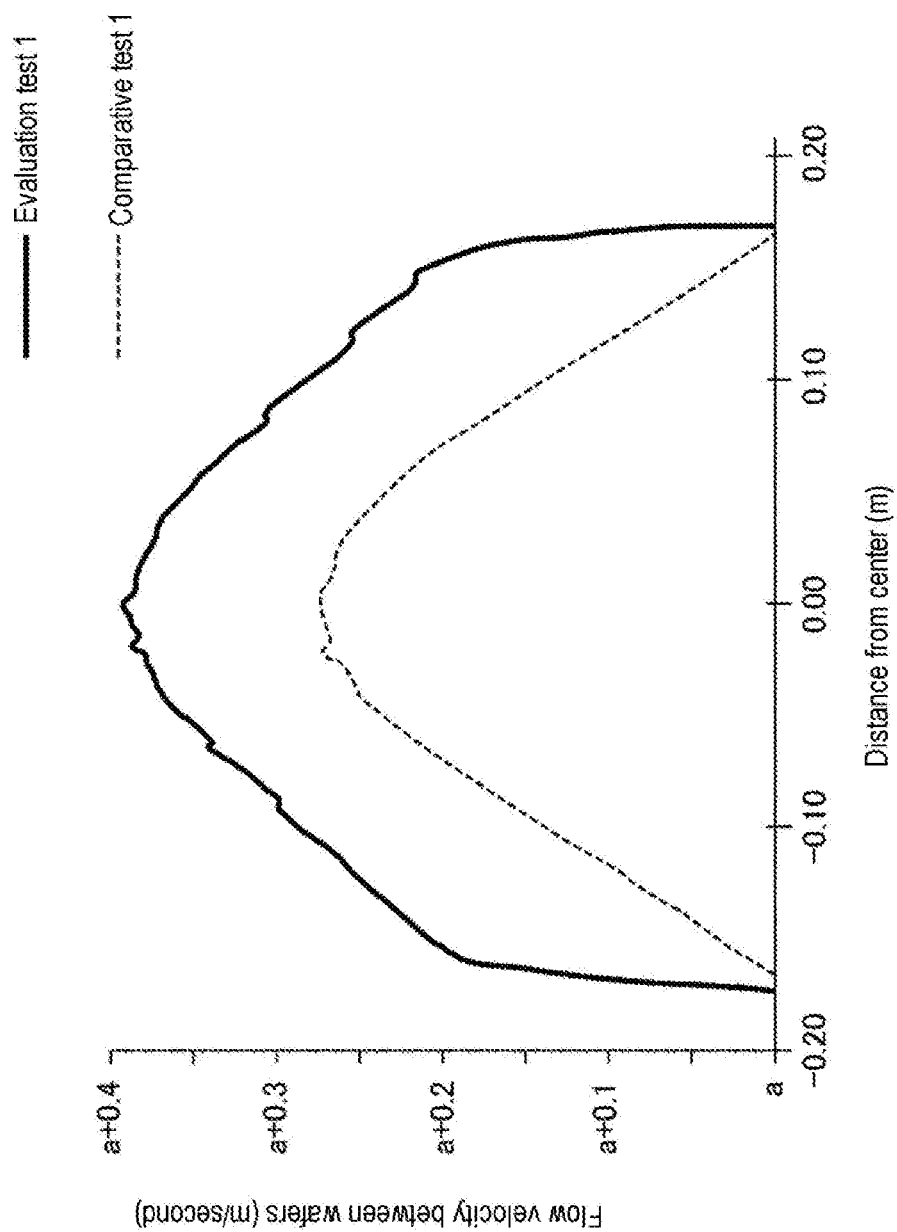
FIG. 14 is a graph showing the results of evaluation tests.

A graph of FIG. 14 shows the distributions of flow velocities in the gaps between the wafers W, which were acquired on a diametrical line extending in a left-right direction of the wafers W. The distribution of flow velocities acquired in evaluation test 1 is indicated by a solid line. The distribution of flow velocities acquired in comparative test 1 is indicated by a dotted line. The horizontal axis in the graph indicates the distance (unit: m) from the center (0 mm) of the wafer W to the position where the flow velocity is detected. The right side of the reaction vessel 11 is indicated by positive values and the left side of the reaction vessel 11 is indicated by negative values. The vertical axis in the graph indicates the detected flow velocity (unit: m/second). A character "a" in the vertical axis is a positive number. From this graph, it can be noted that the flow velocity in the same position is larger in evaluation test 1 than in comparative test 1. Thus, the effects of the present disclosure mentioned above were confirmed from the results of evaluation tests.

According to the present disclosure in some embodiments, gas flow guide parts having peripheral edge portions protruding outward beyond substrates are installed in columns of a substrate holder for each of the substrates. Further, baffle parts are installed independently of the substrate holder at left and right sides of a substrate holding region so that the baffle parts protrude from the outer side toward a space between the mutually-adjoining gas flow guide parts and run into the space. It is therefore possible to supply a process gas between the substrates in an efficient manner and at a high flow velocity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vertical heat treatment apparatus for performing a process by forming a gas flow of a process gas flowing in a transverse direction from one side toward the other side, the vertical heat treatment apparatus comprising:
    a vertical reaction vessel configured to accommodate a plurality of substrates disposed in a shelf-like fashion;
    a heater surrounding the vertical reaction vessel;
    a substrate holder including a column, a plurality of holders installed along the column, and cutouts,
        wherein a center portion of each holder is configured to hold each substrate, and a peripheral edge portion of each holder is respectively installed in the column in a corresponding relationship with each substrate and is formed to protrude outward beyond each substrate;
    an elevator stand configured to support the substrate holder and to load the substrate holder into the reaction vessel from below the reaction vessel;
    a rotating mechanism including a motor, installed in the elevator stand, and configured to rotate the substrate holder about a vertical axis;
    a process gas supply port and an exhaust port respectively formed at a rear side and a front side of a substrate holding region where the substrates are held;
    a plurality of baffle parts installed in a sidewall of the reaction vessel independently of the substrate holder at a left side and a right side of the reaction vessel so that a distal end of each baffle part protrudes from the sidewall of the reaction vessel, and extends into a space between the peripheral edge portions of the plurality of holders adjoining each other to be interposed between the peripheral edge portions of the plurality of holders adjoining each other,
        wherein the cutouts of the substrate holder are formed in portions facing the baffle parts in the plurality of holders in a top plan view; and
    a controller configured to control process steps including:
        positioning an orientation of the cutouts of the substrate holder by rotating the substrate holder about the vertical axis using the rotating mechanism so that the cutouts directly face the plurality of baffle parts;
        loading the substrate holder holding the substrates into the reaction vessel so that the distal end of each baffle part is interposed between the peripheral edge portions of the plurality of holders adjoining each other;
        rotating the substrate holder loaded into the reaction vessel by the rotating mechanism;
        supplying the process gas via the process gas supply port to the substrates held in the substrate holder;
        stopping the supply of the process gas from the process gas supply port;
        re-positioning the orientation of the cutouts of the substrate holder so that the cutouts directly face the plurality of baffle parts; and
        unloading the substrate holder from the reaction vessel.

2. The apparatus of claim 1, wherein a first state and a second state are alternately repeated while the substrate holder is rotated by the rotating mechanism,
    wherein a distal end portion of each baffle part and the peripheral edge portion of each holder do not overlap with each other in the top plan view in the first state, and
    wherein the distal end portion of each baffle part and the peripheral edge portion of each holder overlap with each other in the top plan view in the second state.

3. The apparatus of claim 2, wherein the baffle parts protrude from a plurality of regions on the sidewall of the reaction vessel, the plurality of regions being spaced apart from each other in a circumferential direction.

4. The apparatus of claim 3, wherein the baffle parts are installed at a front left side, a front right side, a rear left side, and a rear right side of the reaction vessel.

5. The apparatus of claim 1, wherein the baffle parts protrude from a plurality of regions on the sidewall of the reaction vessel, the plurality of regions being spaced apart from each other in a circumferential direction.

6. The apparatus of claim 5, wherein the baffle parts are installed at a front left side, a front right side, a rear left side, and a rear right side of the reaction vessel.

7. The apparatus of claim 1, wherein the baffle parts are installed at a front left side, a front right side, a rear left side, and a rear right side of the reaction vessel.

* * * * *